United States Patent
Ji

(10) Patent No.: US 9,519,377 B2
(45) Date of Patent: Dec. 13, 2016

(54) GATE DRIVING CIRCUIT, ARRAY SUBSTRATE, DISPLAY DEVICE AND DRIVING METHOD

(71) Applicants: BOE TECHNOLOGY GROUP CO., LTD., Beijing (CN); CHENGDU BOE OPTOELECTRONICS TECHNOLOGY CO., LTD., Chengdu, Sichuan (CN)

(72) Inventor: Bin Ji, Beijing (CN)

(73) Assignees: BOE TECHNOLOGY GROUP CO., LTD., Beijing (CN); CHENGDU BOE OPTOELECTRONICS TECHNOLOGY CO., LTD., Chengdu, Sichuan (CN)

( * ) Notice: Subject to any disclaimer, the term of this patent is extended or adjusted under 35 U.S.C. 154(b) by 6 days.

(21) Appl. No.: 14/649,274

(22) PCT Filed: Sep. 2, 2014

(86) PCT No.: PCT/CN2014/085703
§ 371 (c)(1),
(2) Date: Jun. 3, 2015

(87) PCT Pub. No.: WO2015/192478
PCT Pub. Date: Dec. 23, 2015

(65) Prior Publication Data
US 2016/0266700 A1 Sep. 15, 2016

(30) Foreign Application Priority Data
Jun. 18, 2014 (CN) .......................... 2014 1 0274166

(51) Int. Cl.
*G09G 3/36* (2006.01)
*G06F 3/041* (2006.01)

(52) U.S. Cl.
CPC ........... *G06F 3/0416* (2013.01); *G06F 3/0412* (2013.01); *G09G 3/3677* (2013.01); *G09G 2310/0286* (2013.01)

(58) Field of Classification Search
CPC ...................... G09G 3/3677; G09G 2310/0286
(Continued)

(56) References Cited

U.S. PATENT DOCUMENTS

2004/0183770 A1 9/2004 Yoo et al.
2008/0238844 A1* 10/2008 Kakiuchi ............. G09G 3/3611
345/87
(Continued)

FOREIGN PATENT DOCUMENTS

CN 101853643 A 10/2010
CN 2011-018012 A 1/2011
(Continued)

OTHER PUBLICATIONS

International Search Report mailed Mar. 23, 2015; PCT/CN2014/085703.
(Continued)

*Primary Examiner* — Michael Pervan
(74) *Attorney, Agent, or Firm* — Ladas & Parry LLP

(57) ABSTRACT

The present disclosure relates to a field of fabrication of liquid crystal display, and more particularly, provides a gate driving circuit, an array substrate, a display device and a driving method. For the problem that TSP signal acquisition of each frame is scanned at a fixed time such that dark lines might appear as viewed by human eyes, the present disclosure provides delay shift modules in at least two different positions, and controls whether they operate or not by a switch control module, an effect of staggering a predetermined time for which a panel suspends operation between adjacent frames is achieved. The present disclosure can
(Continued)

stagger the predetermined time for which the touch screen panel suspends operation within adjacent odd and even frames, so as to solve the problem of the dark lines as viewed by human eyes.

11 Claims, 9 Drawing Sheets

(58) Field of Classification Search
  USPC .................................. 345/98–100; 377/64–81
  See application file for complete search history.

(56) References Cited

U.S. PATENT DOCUMENTS

2009/0085907 A1     4/2009  Kim
2015/0091822 A1*    4/2015  Dong .................... G06F 3/0416
                                                  345/173

FOREIGN PATENT DOCUMENTS

| CN | 103456259 A | 12/2013 |
| CN | 103489391 A | 1/2014 |
| CN | 203982752 A | 12/2014 |
| CN | 101777301 A | 7/2015 |

OTHER PUBLICATIONS

Written Opinion of the International Searching Authority mailed Mar. 23, 2015; PCT/CN2014/085703.

* cited by examiner

GATE DRIVING CIRCUIT, ARRAY SUBSTRATE, DISPLAY DEVICE AND DRIVING METHOD

TECHNICAL FIELD

The present disclosure relates to a field of fabrication of liquid crystal display, and more particularly, relates to a gate driving circuit, an array substrate, a display device and a driving method.

BACKGROUND

In recent years, a liquid crystal display presents a development trend of high integration and low cost. A very important technology thereof is implementation of mass production of a Gate Driver on Array (GOA) technology. A gate switching circuit is integrated onto an array substrate of a liquid crystal display panel by using the GOA technology, so as to save a gate driving integrated circuit part, and reduce production cost in both material and fabrication process. The gate switching circuit integrated onto the array substrate by using the GOA technology is also referred to as a GOA gate driving circuit.

In the gate driving circuit applied to a Touch Screen Panel (TSP), in order that a gate line drive signal (also referred to as a GATE signal) between shift register units that stops transmission is stored when a TSP signal is scanned, a delay shift module will be added between adjacent shift register units at two stages. The delay shift module is used for temporarily storing the gate line drive signal transmitted here, and continuing to transmit the gate line drive signal downwards after the scanning of the TSP signal is done.

A position of the delay shift module in the gate driving circuit is fixed. As shown in FIG. 1(b), the delay shift module includes a first shift register DUMMY1 and a second shift register DUMMY2. Output terminals of the first shift register DUMMY1 and the second shift register DUMMY2 are idle, and have no output to the gate line. In a process of transmitting the gate line drive signal within each frame, the shift register unit will suspend operation at a same predetermined time. Therefore, a row of pixels corresponding to the gate driving circuit will periodically suspend light emission. Thus, there will be a problem of a dark line as viewed by human eyes, so that the panel cannot properly display.

SUMMARY

(I) Technical Problem to be Solved

For deficiencies of the prior art, the present disclosure provides a gate driving circuit, an array substrate, a display device and a driving method, which can stagger a time for which a touch screen panel suspends operation within adjacent frames, so as to solve the problem of dark lines as viewed by human eyes.

(II) Technical Solutions

To achieve the above objective, the present disclosure is implemented by the technical solutions as below.

A gate driving circuit comprises a plurality of shift register units connected in cascade. The gate driving circuit further comprises: at least two delay shift modules and a switch control module respectively connected with the delay shift modules, each delay shift module being located between adjacent shift register units, and at least one cascaded shift register unit being further provided between the delay shift modules; the switch control module being used for controlling different delay shift modules to be connected between the adjacent shift register units between adjacent frames, and enabling transmission of a gate line drive signal to skip other delay shift modules not connected therein, within each frame.

The delay shift module is used for suspending a clock signal connected with the delay shift module for a predetermined time when connected between the adjacent shift register units, storing the gate line drive signal from the shift register unit at an adjacent previous stage within the predetermined time for which the clock signal is suspended, and transmitting the gate line drive signal to the shift register unit at an adjacent next stage after the clock signal is restored.

Preferably, the switch control module includes a group of switch elements corresponding to each of the delay shift modules, each group of switch elements being used for outputting a switch control signal to the delay shift module corresponding thereto. The switch control signal controls the delay shift module to be connected between the adjacent shift register units, or enabling the transmission of the gate line drive signal to skip the delay shift module.

Preferably, each group of switch elements includes a first switch element and a second switch element. In a group of switch elements corresponding to a delay shift module between shift register unit at an (N−1)-th stage and that at an N-th stage, a first terminal of the first switch element and a first terminal of the second switch element are both connected with an output terminal of the shift register unit at the (N−1)-th stage; a second terminal of the first switch element is connected with an input terminal of the delay shift module; an output terminal of the delay shift module is connected with an input terminal of the shift register unit at the N-th stage; a second terminal of the second switch element is connected with an output terminal of the shift register unit at the N-th stage; a control terminal of the first switch element is connected with a first control signal line, and a control terminal of the second switch element is connected with a second control signal line.

Preferably, the switch element is a thin film field-effect transistor.

Preferably, the delay shift module includes a first shift register unit and a second shift register unit connected in cascade, the two shift register units being connected in cascade between the shift register units at the (N−1)-th stage and the N-th stage, an input terminal of the first shift register unit serving as the input terminal of the delay shift module, and an output terminal of the second shift register unit serving as the output terminal of the delay shift module, the input terminal of the first shift register unit being connected with the output terminal of the shift register unit at the (N−1)-th stage via the first switch element; the output terminal of the first shift register unit and a reset terminal of the second shift register unit being connected with the output terminal of the shift register unit at the N-th stage and a reset terminal of the shift register unit at the (N−1)-th stage at one point, and N being an integer no less than 2.

An array substrate is provided, wherein, the array substrate comprises any gate driving circuit as described above.

A display device is provided, wherein, the display device comprises any array substrate as described above.

A driving method used in the above-described gate driving circuit is provided, wherein, the method comprises: controlling different delay shift modules to be connected between adjacent shift register units, between adjacent frames, by a switch control module; enabling transmission of a gate line drive signal to skip other delay shift modules not connected therein, within each frame, by the switch control module.

Preferably, when the delay shift module is connected between the adjacent shift register units, by suspending a clock signal connected with the delay shift module for a predetermined time, a touch scanning stage is entered within the predetermined time for which the clock signal is suspended.

Preferably, the switch control module includes a group of switch elements corresponding to each of the delay shift modules, each group of switch elements including a first switch element and a second switch element. In a group of switch elements corresponding to a delay shift module between shift register units at an (N-1)-th stage and an N-th stage, a first terminal of the first switch element and a first terminal of the second switch element are both connected with an output terminal of the shift register unit at the (N-1)-th stage; a second terminal of the first switch element is connected with a gate line drive signal input terminal of the delay shift module; a gate line drive signal output terminal of the delay shift module is connected with an input terminal of the shift register unit at the N-th stage; a second terminal of the second switch element is connected with an output terminal of the shift register unit at the N-th stage; a control terminal of the first switch element is connected with a first control signal line, and a control terminal of the second switch element is connected with a second control signal line;

The controlling different delay shift modules to be connected between adjacent shift register units, between adjacent frames, by a switch control module specifically includes: controlling the output terminal of the shift register unit at the (N-1)-th stage to be connected with the input terminal of the delay shift module by the first switch element, at a start time of the predetermined time for which the clock signal is suspended, within a frame, the delay shift module being connected between the adjacent shift registers, and other delay shift modules controlling the output terminal of the shift register unit at the (N-1)-th stage to be connected with the input terminal of the shift register at the N-th stage by the second switch element.

Preferably, when the delay shift module is connected between the adjacent shift register units, the first control signal line controls the first switch element to be ON before output of the clock signal is suspended for a clock cycle, and controls the first switch element to be ON after the output of the clock signal is restored for a clock cycle.

(III) Advantageous Effects

The present disclosure at least has the advantageous effects as follows: mainly by means of providing the delay shift modules in at least two different positions, and controlling whether they operate or not by a corresponding switch control module, the present disclosure achieves an effect of staggering the predetermined time for which a panel suspends operation between adjacent frames.

Specifically, when each switch control module has circuits of two switch elements, and when one of the switch elements is in an ON state, the gate line drive signal will directly skip corresponding delay shift module to be transmitted downwards; and when the other switch element is in the ON state, the gate line drive signal will enter the delay shift module, which represents that it enters a normal operation state. Thus, as long as the switch elements in each switch control module are opened and closed under the control of the control signal, the operation state thereof can be switched flexibly. Here, in order to stagger the positions of the delay shift modules in the adjacent frames, only one delay shift module may be made operate in an odd frame, and the gate line drive signal directly skip other delay shift modules; correspondingly, only the other delay shift module is made operate in an even frame, and the gate line drive signal directly skip remained delay shift modules except the other delay shift module. Thus, the predetermined time for which the touch screen panel suspends operation within adjacent odd and even frames is staggered, so as to solve the problem of the dark lines as viewed by human eyes.

Of course, all the advantages as described above may not be necessarily achieved at the same time by implementing any product or method of the present disclosure.

BRIEF DESCRIPTION OF THE DRAWINGS

In order to clearly illustrate the technical solutions of the embodiments of the present disclosure or the prior art, the drawings that need to be used in the embodiments or the prior art will be briefly described hereinafter. It is obvious that the described drawings are only related to some embodiments of the present disclosure, those ordinary skilled in the art can obtain other drawings based on the drawings, without any inventive work.

REFERENCE SIGNS

CK, CKB—a clock signal, or a clock signal terminal of a shift register unit;
STY—a gate line drive signal, or an input terminal of the shift register unit;
Output—an output terminal of the shift register unit;
RST—a reset terminal of the shift register unit;
G1, G2, GN, . . . , GM, . . . —serial numbers of the shift register units at a first stage, a second stage, . . . , an N-th stage, . . . , an M-th stage . . . , or output signals thereof;
GOA unit—the shift register unit;
Q1—a first switch element;
Q2—a second switch element;
Q3—a third switch element;
Q4—a fourth switch element;
DUMMY1—a first shift register unit of a first delay shift module, or an output signal thereof;
DUMMY2—a second shift register unit of the first delay shift module, or an output signal thereof;
DUMMY3—a third shift register unit of a second delay shift module, or an output signal thereof;

DUMMY4—a fourth shift register unit of the second delay shift module, or an output signal thereof;
CTL_A—a first control signal (line);
CTL_B—a second control signal (line).

DESCRIPTION OF THE EMBODIMENTS

In order to make objects, technical details and advantages of the embodiments of the present disclosure apparent, the technical solutions of the embodiment will be described in a clearly and fully understandable way in connection with the drawings related to the embodiments of the present disclosure. It is obvious that the described embodiments are just part of but not all of the embodiments of the disclosure. Based on the embodiments of the present disclosure, all the other embodiments that a person ordinarily skilled in the art obtains without inventive effort are within the scope of the present disclosure.

Embodiment 1

Figure 1A:
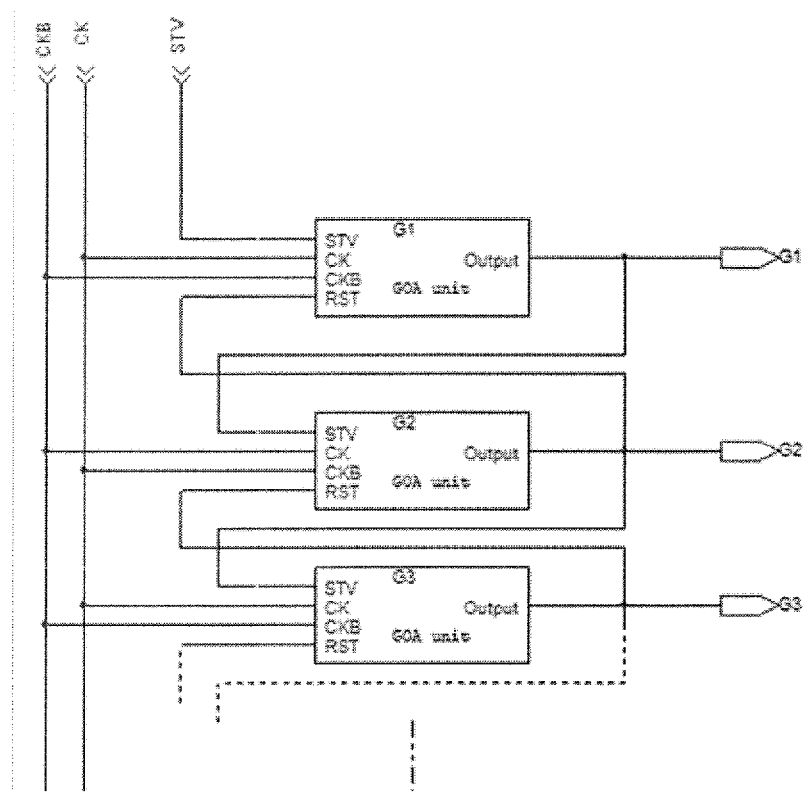
FIG. 1(a), FIG. 1(b) and FIG. 1(c) are respectively cascade diagrams of part of the shift register units of the gate driving circuit in the prior art.
Figure 1B:
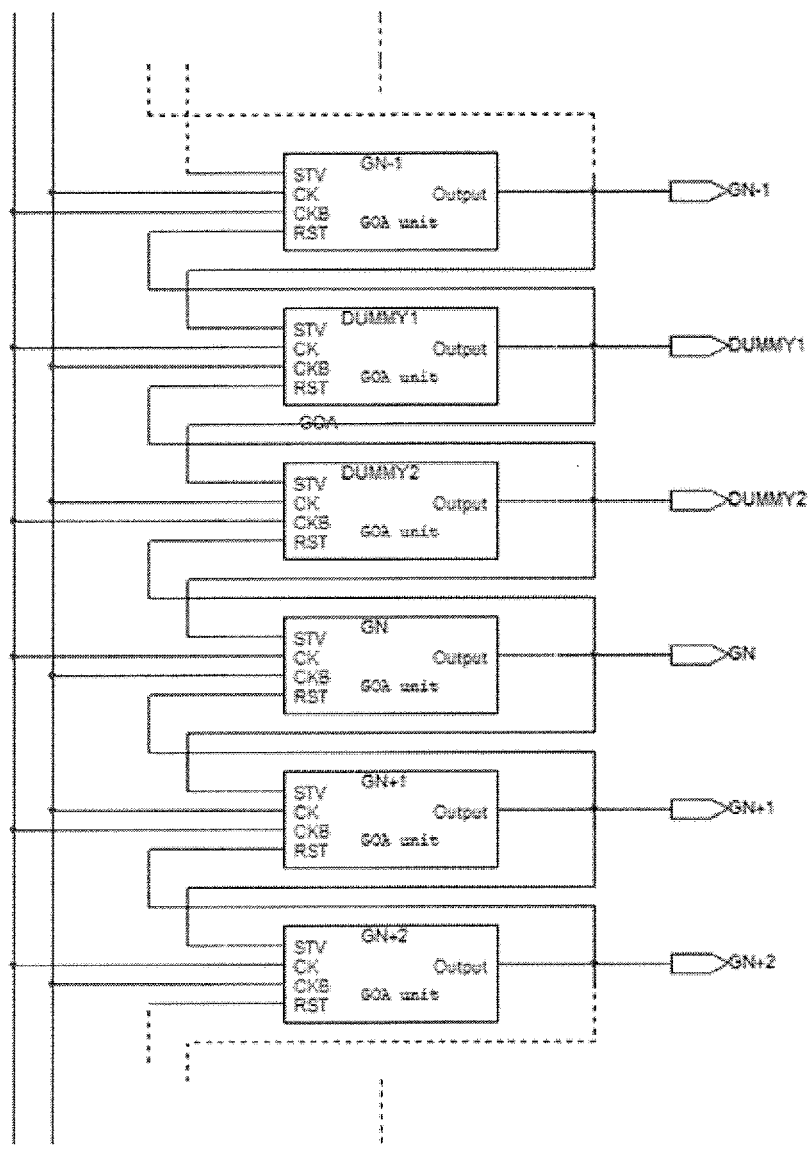
Figure 1C:
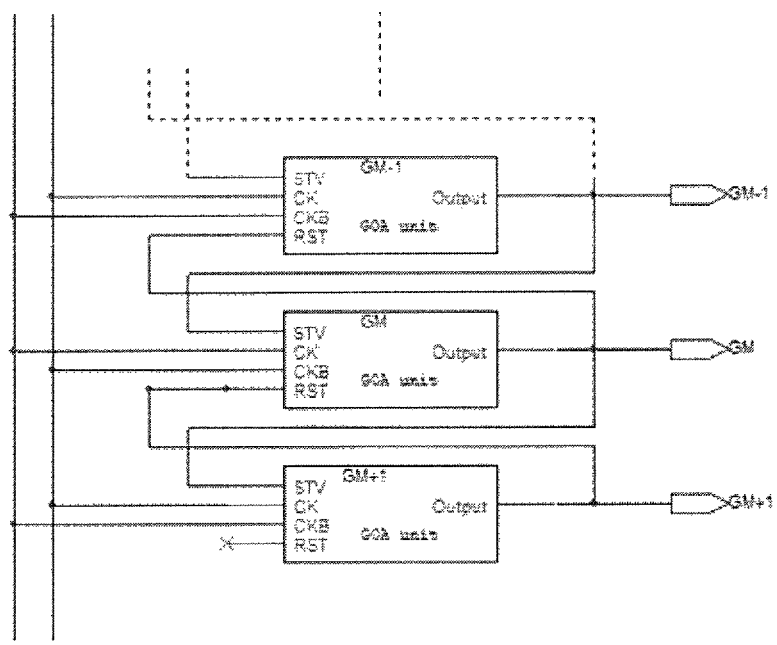

The embodiment of the present disclosure proposes a gate driving circuit. The gate driving circuit comprises: a plurality of shift register units connected in cascade, with reference to FIG. 1(a), FIG. 1(b) and FIG. 1(c). FIG. 1(a), FIG. 1(b) and FIG. 1(c) constitute a complete gate driving circuit. A clock signal terminal of each shift register unit has a corresponding clock signal input. An output terminal at a previous stage is connected with an input terminal at a next stage sequentially, which represents that a gate line drive signal is transmitted stage by stage sequentially under the control of the clock signal. The output terminal at the next stage is further connected with a reset terminal at the previous stage, which represents that the signal at the previous stage will be reset after the transmission at the next stage is completed, so as to prepare signal transmission of a next time. It should be noted that, the wording "connected in cascade" in the gate driving circuit specifically refers to a connection relationship including the above-described connection mode and a similar connection mode, which is a technical term of a clear meaning in the shift register and the gate driving circuit in the prior art.

Figure 2:
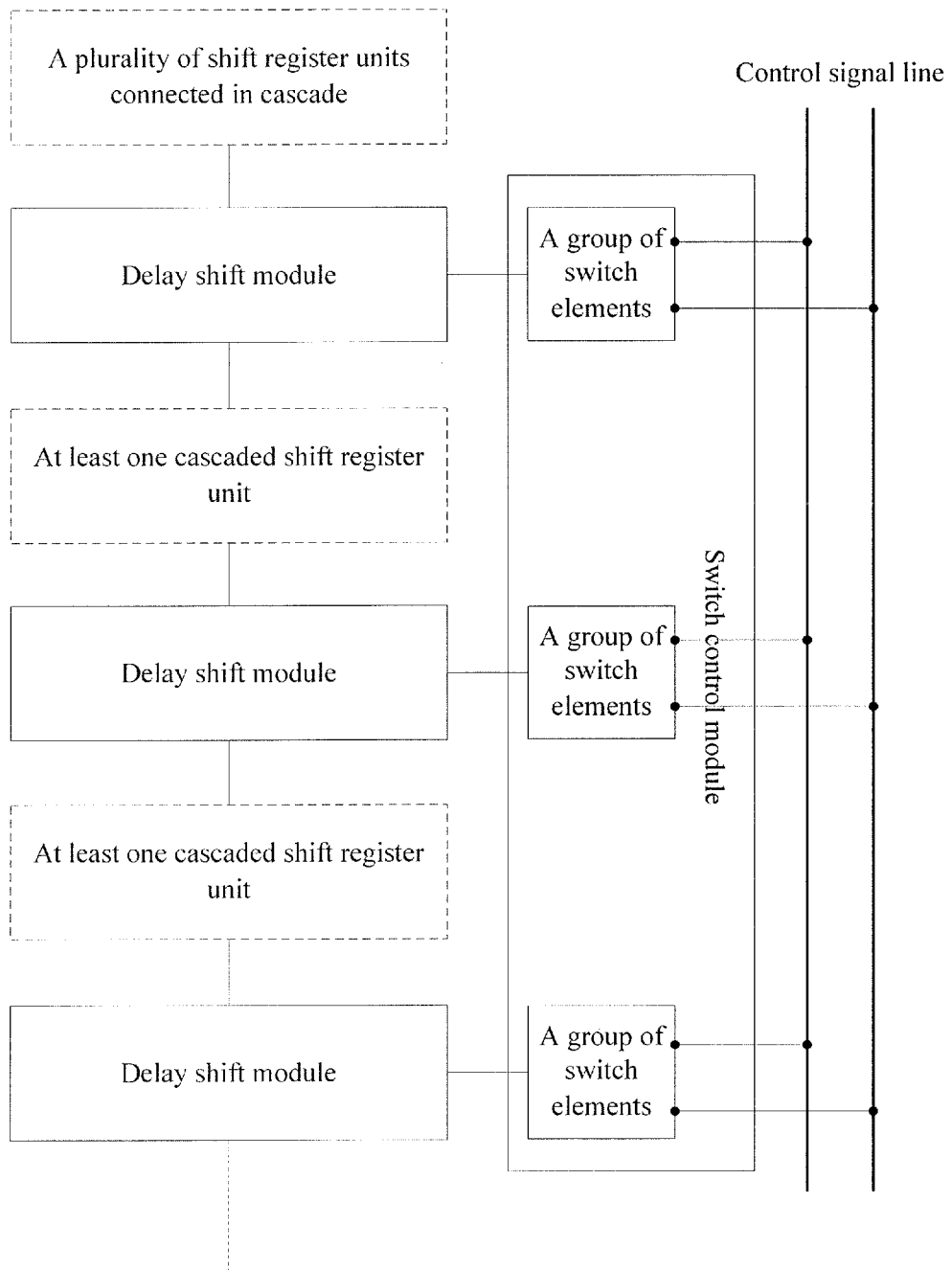
FIG. 2 is a circuit structural diagram of the gate driving circuit in an embodiment of the present disclosure.

With reference to FIG. 2, the gate driving circuit according to the embodiment of the present disclosure further comprises at least two delay shift modules and switch control modules respectively connected with the delay shift modules. The delay shift module is located between adjacent shift register units, and at least one cascaded shift register unit is further provided between the delay shift modules. The switch control module is used for controlling different delay shift modules to be connected between the adjacent shift register units between adjacent frames, and enabling transmission of a gate line drive signal to skip other delay shift modules not connected therein, within each frame.

The delay shift module is used for suspending a clock signal connected with the delay shift module for a predetermined time when the delay shift module is connected between the adjacent shift register units, storing the gate line drive signal from an adjacent previous stage of shift register unit at within the predetermined time for which the clock signal is suspended, and transmitting the gate line drive signal to an adjacent next stage of shift register unit after the clock signal is restored.

Therein, the switch control module is implemented by a group of switch elements correspondingly connected with each of the delay shift modules. In FIG. 2, the gate driving circuit comprising three delay shift modules and a group of switch elements correspondingly connected with the delay shift modules respectively is taken as an example.

It can be seen that, by means of providing the delay shift modules in at least two different positions, and controlling whether they operate or not by the corresponding switch control module, the gate driving circuit achieves an effect of staggering the predetermined time for which a panel suspends operation in the adjacent frames.

Embodiment 2

Figure 3A:
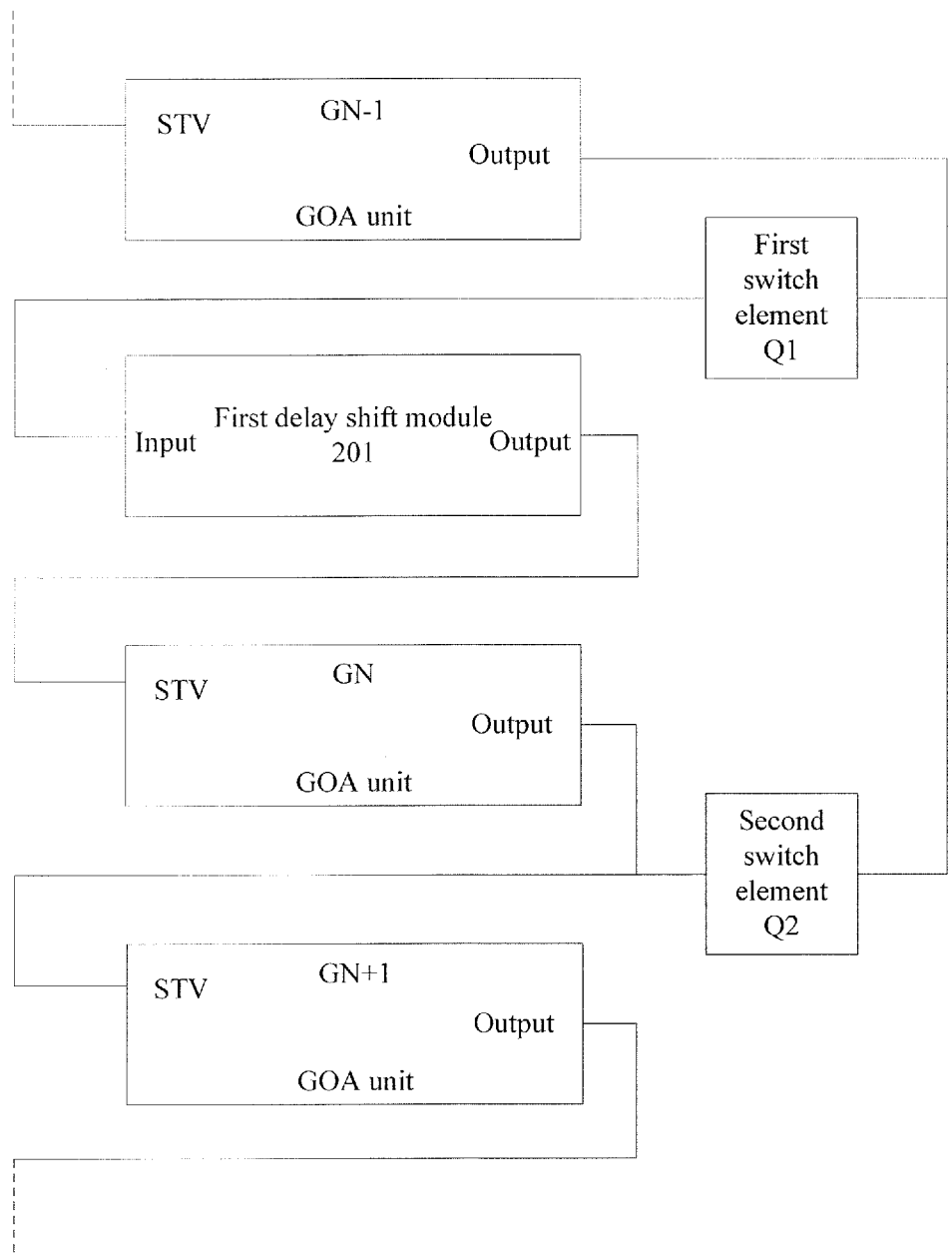
FIG. 3(a) is a circuit structural diagram of a first delay shift module part of the gate driving circuit in the embodiment of the present disclosure.
Figure 3B:
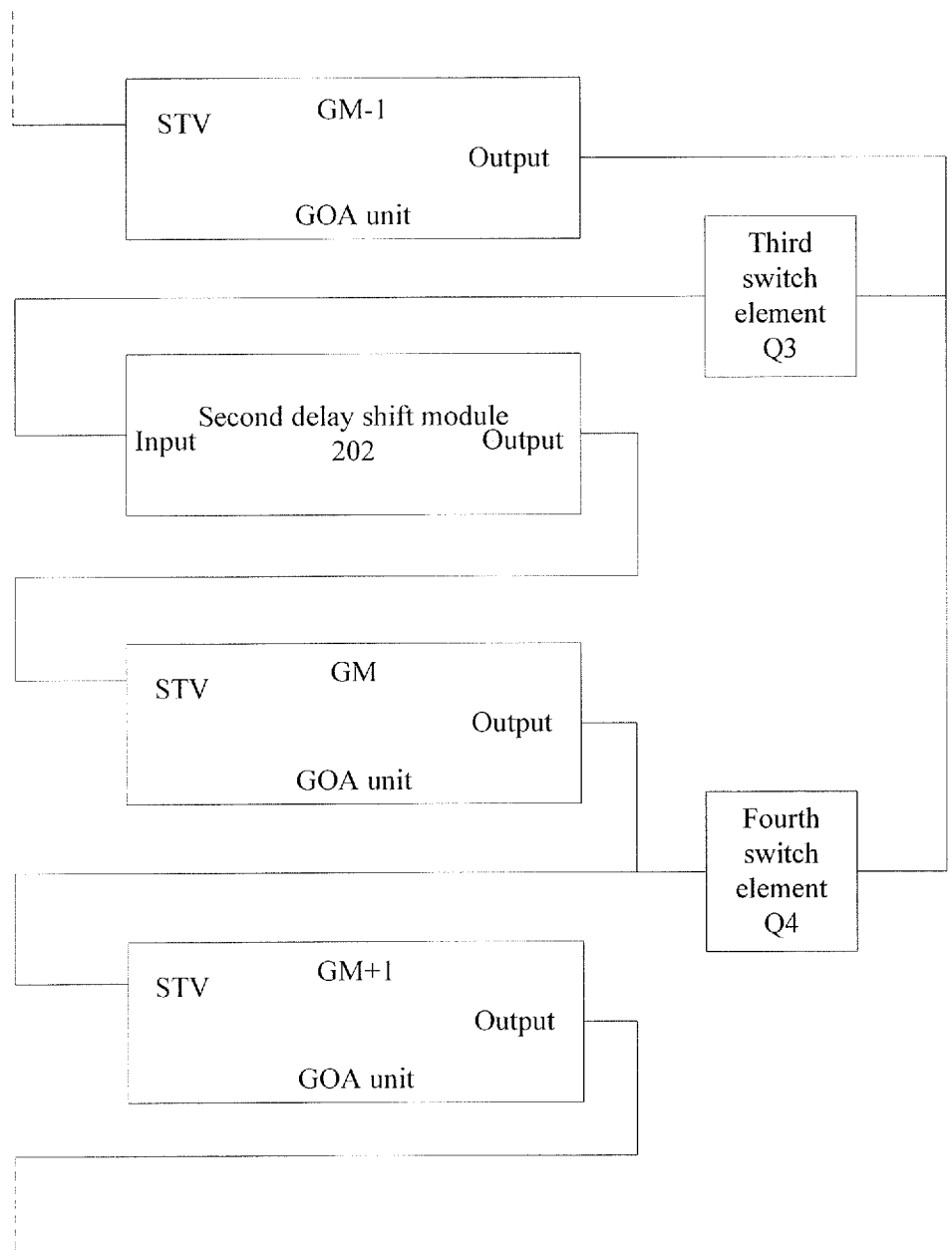
FIG. 3(b) is a circuit structural diagram of a second delay shift module part of the gate driving circuit in the embodiment of the present disclosure.

The embodiment of the present disclosure proposes a gate driving circuit having only two delay shift modules. Each switch control module includes two switch elements (two switch elements in each group), with reference to FIG. 3(a) and FIG. 3(b). FIG. 3(a) and FIG. 3(b) are a complete gate driving circuit.

The gate driving circuit, in addition to the plurality of shift register units connected in cascade, further comprises: a first delay shift module 201, whose input terminal is connected with a second terminal of a first switch element Q1, and whose output terminal is connected with an input terminal of a shift register unit at an N-th stage; the first switch element Q1, whose first terminal is connected with an output terminal of a shift register unit at an (N−1)-th stage; a second switch element Q2, whose first terminal is connected with the output terminal of the shift register unit at the (N−1)-th stage, and whose second terminal is connected with an input terminal STV of a shift register unit at an (N+1)th stage and an output terminal of the shift register unit at the N-th stage; a second delay shift module 202, whose input terminal is connected with a second terminal of a third switch element Q3, and whose output terminal is connected with an input terminal of a shift register unit at an M-th stage; the third switch element Q3, whose first terminal is connected with an output terminal of a shift register unit at an (M−1)-th stage; and a fourth switch element Q4, whose first terminal is connected with the output terminal of the shift register unit at the (M−1)-th stage, and whose second terminal is connected with an input terminal STV of a shift register unit at an (M+1)-th stage and an output terminal of the shift register unit at the M-th stage; wherein, M and N are positive integers greater than 1, and M is greater than N.

The gate driving circuit provided by the embodiment of the present disclosure can stagger the predetermined time for which a touch screen panel suspends operation within adjacent odd and even frames, so as to solve the problem of the dark lines as viewed by human eyes.

Figure 4A:
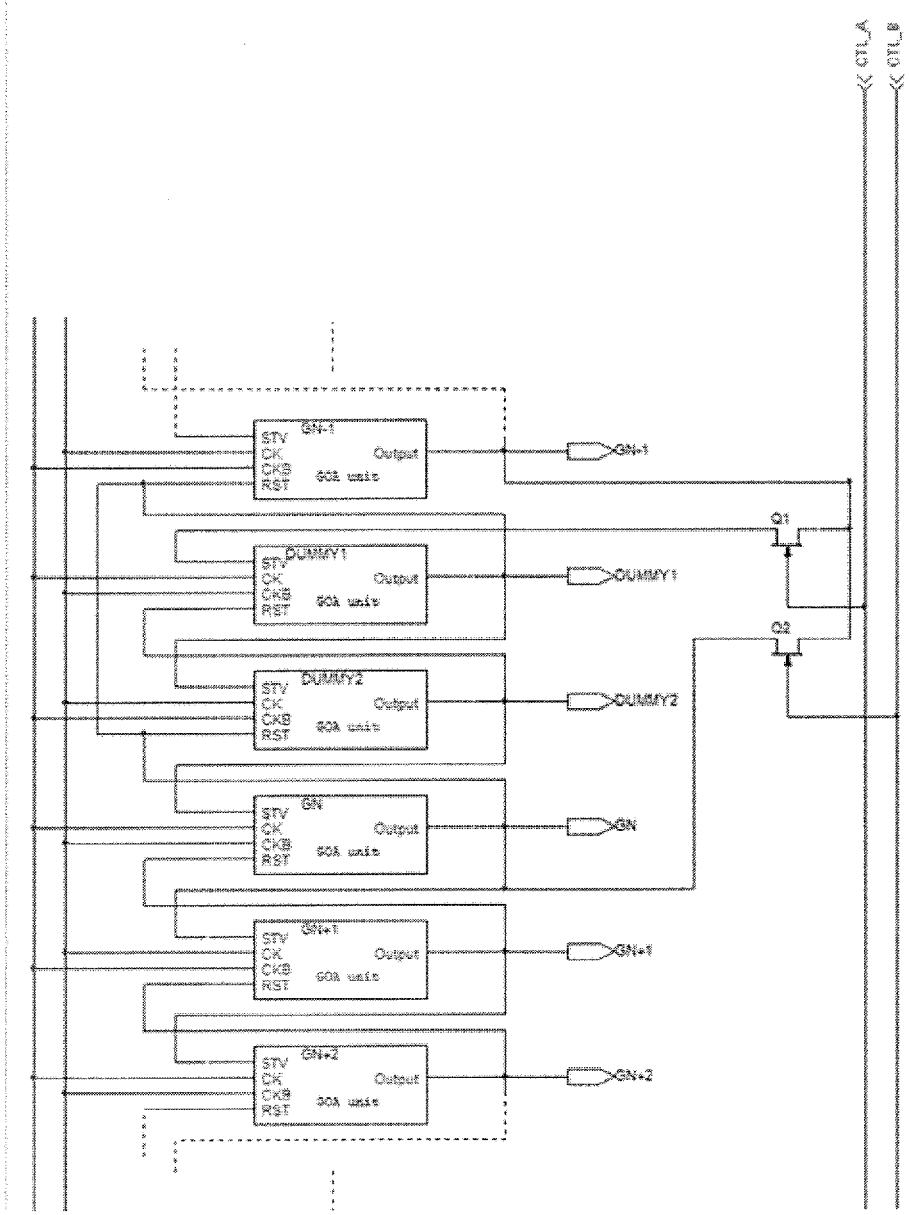
FIG. 4(a) and FIG. 4(b) are partial circuit diagrams of a preferred gate driving circuit in an embodiment of the present disclosure.
Figure 4B:
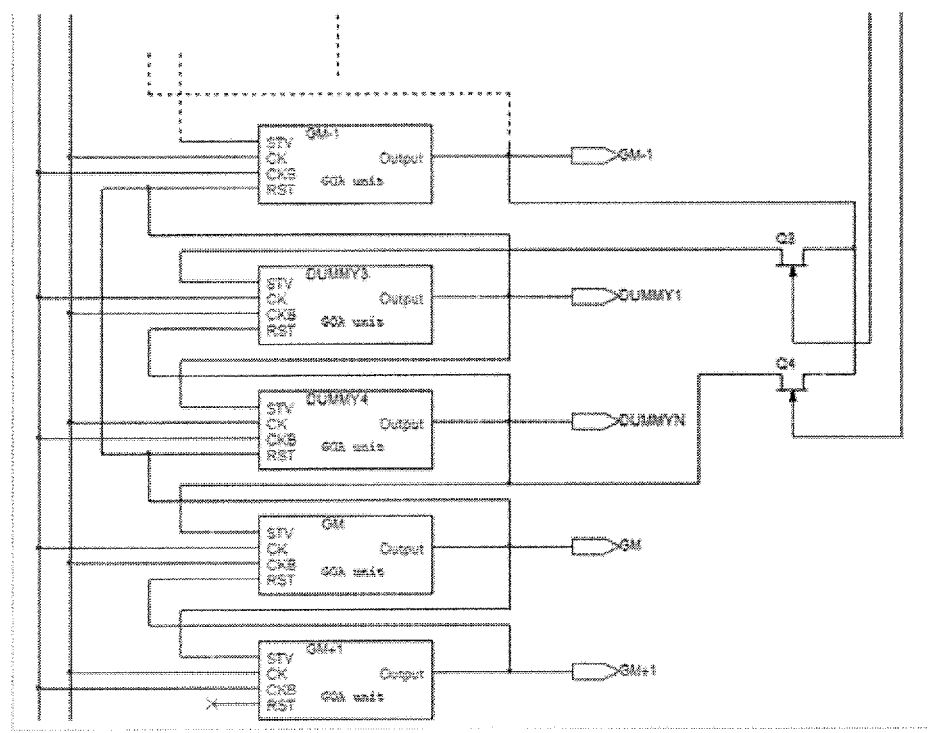

Hereinafter, a more specific preferred gate driving circuit will be introduced, with reference to FIG. 4(a) and FIG. 4(b). FIG. 4(a) and FIG. 4(b) are a complete gate driving circuit. Based on the above-described gate driving circuit, the first delay shift module includes a first shift register unit DUMMY1 and a second shift register unit DUMMY2 connected in cascade sequentially. An input terminal STV of the first shift register unit serves as the input terminal of the first delay shift module, and an output terminal Output of the second shift register unit serves as the output terminal of the first delay shift module. The output terminals of the first shift register unit DUMMY1 and the second shift register unit DUMMY2 are not connected with corresponding gate lines.

The second delay shift module includes a third shift register unit DUMMY3 and a fourth shift register unit DUMMY4 connected in cascade sequentially. An input terminal STV of the third shift register unit serves as the input terminal of the second delay shift module, and the output terminal Output of the second shift register unit serves as the output terminal of the second delay shift module. The output terminals of the third shift register unit DUMMY3 and the fourth shift register unit DUMMY4 are not connected with corresponding gate lines.

For the first delay shift module, the output terminal Output of the first shift register unit, a reset terminal RST of the second shift register unit, the output terminal Output of the shift register unit at the N-th stage, and a reset terminal RST of the shift register unit at the (N−1)-th stage are connected at one point. For the second delay shift module, the output terminal Output of the third shift register unit DUMMY3, a reset terminal RST of the fourth shift register unit DUMMY4, an output terminal Output of the shift register unit at the M-th stage, and a reset terminal RST of the shift register unit at the (M−1)-th stage are connected at one point.

The gate driving circuit further comprises: a first control signal line CTL_A, which is connected with control terminals of the first switch element Q1 and the third switch element Q3; a second control signal line CTL_B, which is connected with control terminals of the second switch element Q2 and the fourth switch element Q4.

Under a preferred condition, the switch element is a field-effect transistor. In this case, preferably, the first terminal of the switch element is a drain of the field-effect transistor, the second terminal of the switch element is a source of the field-effect transistor, and the control terminal of the switch element is a gate of the field-effect transistor. More preferably, the field-effect transistor is a Thin Film field-effect Transistor (TFT).

For such a delay shift module, when a TSP signal acquisition process begins, clock signals CK and CKB will stop operating (for example, they will change into a constant low level), and the corresponding gate line drive signal will be maintained in the first shift register unit DUMMY1. After the acquisition process comes to an end, the clock signals CK and CKB will continue to operate, and driven thereby, the gate line drive signal will be transmitted to the shift register unit at a next stage continuously. Because a clock position when the TSP signal acquisition begins is uncertain, abnormal transmission of the gate line drive signal may occur in a process of stopping or resetting the clock (for example, in case of a rising edge and a falling edge, the gate line drive signal is transmitted downwards). The two shift register units here play a role of buffering, so that positions where the gate line drive signal is transmitted before and after the TSP signal acquisition are both corresponding to the clock signals.

Hereinafter, a working principle of the preferred gate driving circuit will be described.

It will be illustrated with reference to the circuit diagrams FIG. 4(a) and FIG. 4(b) in conjunction with the timing of FIG. 5. "Odd Frame" represents an odd frame. "Even Frame" represents an even frame. "TSP work time" represents a TSP signal acquisition time period. At the very beginning, the gate line drive signal is input at the STV. The shift register units transmit the gate line drive signal sequentially under action of the clock signals CK and CKB.

Operation in Odd Frame

When an output signal GN-1 of the shift register unit at the (N−1)-th stage is at a high level, the CTL_A outputs a high level, the CTL_B outputs a low level, the Q1 transistor is turned on, and the Q2 transistor is turned off. At this time, a GN-1 high level signal output by the shift register unit at the (N−1)-th stage is transmitted to the input terminal STV of the first shift register unit DUMMY1, but the CK and the CKB stop operating, the shift register units stop transmitting the gate line drive signal, and the TSP signal acquisition begins.

When the TSP signal acquisition comes to an end, the CK and the CKB restore operating, the CTL_A is still outputting the high level at this time, the input terminal STV of the first shift register unit DUMMY1 receives a high level output signal GN-1 of the shift register unit at the (N−1)-th stage, and outputs the high level signal when the clock signal is at the high level, to transmit it to the input terminal STV of the second shift register unit DUMMY2, and then the CTL_A restores to the low level. Since connection of the reset terminal is designed for the circuit, the shift register unit at each stage will automatically reset the signal in the shift register unit at the previous stage after outputting the high level signal. Since the output terminal Output of the first shift register unit, the reset terminal RST of the second shift register unit, the output terminal Output of the shift register unit at the N-th stage, and the reset terminal RST of the shift register unit at the (N−1)-th stage are connected at one point, when the output terminal GN of the shift register unit at the N-th stage outputs the high level, the shift register unit at the (N−1)-th stage, the first shift register unit DUMMY1 and the second shift register unit DUMMY2 will be reset.

When the shift register unit continues to operate to GM-1, the CTL_A outputs the low level, the CTL_B outputs the high level, the Q3 transistor is turned off, and the Q4 transistor is turned on. At this time, the CK and the CKB continue to operate, and the gate line drive signal skips DUMMY3 and DUMMY4 to the GM input terminal and is transmitted downward continuously. After the GM outputs the high level, the CTL_B restores to the low level.

Operation in Even Frame

When the output signal GN-1 of the shift register unit at the (N−1)-th stage is at the high level, the CTL_A outputs the low level, the CTL_B outputs the high level, the Q1 transistor is turned off, and the Q2 transistor is turned on. At this time, the CK and the CKB continue to operate, and the gate line drive signal skips DUMMY1 and DUMMY2 to the GM input terminal and is transmitted downward continuously. After the GM outputs the high level, the CTL_B restores to the low level.

When the output signal GM-1 of the shift register unit at the (M−1)-th stage is at the high level, the CTL_A outputs the high level, the CTL_B outputs the low level, the Q3 transistor is turned on, and the Q4 transistor is turned off. At this time, the GM-1 high level signal output by the shift register unit at the (M−1)-th stage is transmitted to the input terminal STV of the third shift register unit DUMMY3, but at this time, the CK and the CKB signals stop operating, the shift register units stop transmitting the gate line drive signal, and the TSP signal acquisition begins.

When the TSP signal acquisition comes to an end, the CK and the CKB restore operating, the CTL_A is still outputting the high level at this time, the input terminal STV of the third shift register unit DUMMY3 receives the high level output signal GM-1 of the shift register unit at the (M−1)-th stage, and outputs the high level signal when the clock signal is at the high level, to transmit it to the input terminal STV of the fourth shift register unit DUMMY4, and then the CTL_A restores to the low level. Since connection of the reset terminal is designed for the circuit, the shift register unit at each stage will automatically reset the signal in the shift register unit at the previous stage after outputting the high level signal. Since the output terminal Output of the third shift register unit, the reset terminal RST of the fourth shift register unit, the output terminal Output of the shift register unit at the M-th stage, and the reset terminal RST of the shift register unit at the (M−1)-th stage are connected at one point, when the output terminal GN of the shift register unit at the M-th stage outputs the high level, the shift register unit at the (M−1)-th stage, the third shift register unit DUMMY3 and the fourth shift register unit DUMMY4 will be reset.

Having undergone such a series of processes, when the gate driving circuit is in the odd frame, the first delay shift module stops operating, to acquire the TSP signal. And when the gate driving circuit is in the even frame, the second delay shift module stops operating, to acquire the TSP signal. That is to say, the predetermined times for which the panel suspends operation are staggered within adjacent odd and even frames, so that the times when there are dark lines as viewed by human eyes within each frame cycle are staggered, so as to solve the problem that the dark lines might appear.

Of course, the embodiment of the present disclosure only uses the delay shift modules in two different positions, but those skilled in the art can set delay shift modules in a plurality of different positions under the same inventive concept, so as to further improve the problem that the dark lines might appear, or can select a delay shift module or a switch control module of other structure to implement the same function, without departing from the spirit and scope of the technical solution of the present disclosure.

Embodiment 3

The embodiment of the present disclosure provides an array substrate, comprising a Gate On Array (GOA) region and a display region. The above-described GOA region is provided with any gate driving circuit as described in Embodiment 1 or Embodiment 2.

Since the array substrate provided by the embodiment of the present disclosure and the gate driving circuit provided by Embodiment 1 or 2 have the same technical features, they can solve the same technical problem and generate the same technical effect.

Embodiment 4

Based on the same inventive concept, the embodiment of the present disclosure provides a display device. The display device comprises any array substrate according to Embodiment 3. The display device may be a liquid crystal panel, E-paper, an OLED panel, a mobile phone, a tablet computer, a television, a monitor, a notebook computer, a digital photo frame, a navigator, or any other product or component having a display function.

Since the display device provided by the embodiment of the present disclosure and the gate driving circuit provided by Embodiment 1 or 2 have the same technical feature, they can solve the same technical problem and generate the same technical effect.

Embodiment 5

Corresponding to the above-described gate driving circuit, the embodiment of the present disclosure provides a driving method applied to any gate driving circuit in Embodiment 1 or Embodiment 2. The method comprises: controlling different delay shift modules to be connected between adjacent shift register units, between adjacent frames, by a switch control module; enabling transmission of a gate line drive signal to skip other delay shift modules not connected therein, within each frame, by the switch control module. That is to say, on the basis of any gate driving circuit according to Embodiment 1 or Embodiment 2, the following is implemented by the switch control module: firstly, only one delay shift module is connected within each frame; secondly, different delay shift modules are connected between the adjacent frames; thirdly, when the delay shift module is connected, the delay shift module is located between the adjacent two shift registers; and fourthly, the transmission of the gate line drive signal is made skip other delay shift modules not connected therein, within each frame.

The delay shift modules connected therein within the adjacent frames are all located in different positions, which can stagger the predetermined time for suspending operation within the adjacent frames; and meanwhile, since only one delay shift module is connected within each frame, overall time of each frame does not change. Therefore, the design can solve the problem of the dark lines on the screen as viewed by human eyes when the method is applied to the display device.

Preferably, when the delay shift module is connected between the adjacent shift register units, by suspending a clock signal connected with the delay shift module for a predetermined time, the delay shift module enters a touch scanning stage within the predetermined time for which the clock signal is suspended.

Figure 5:
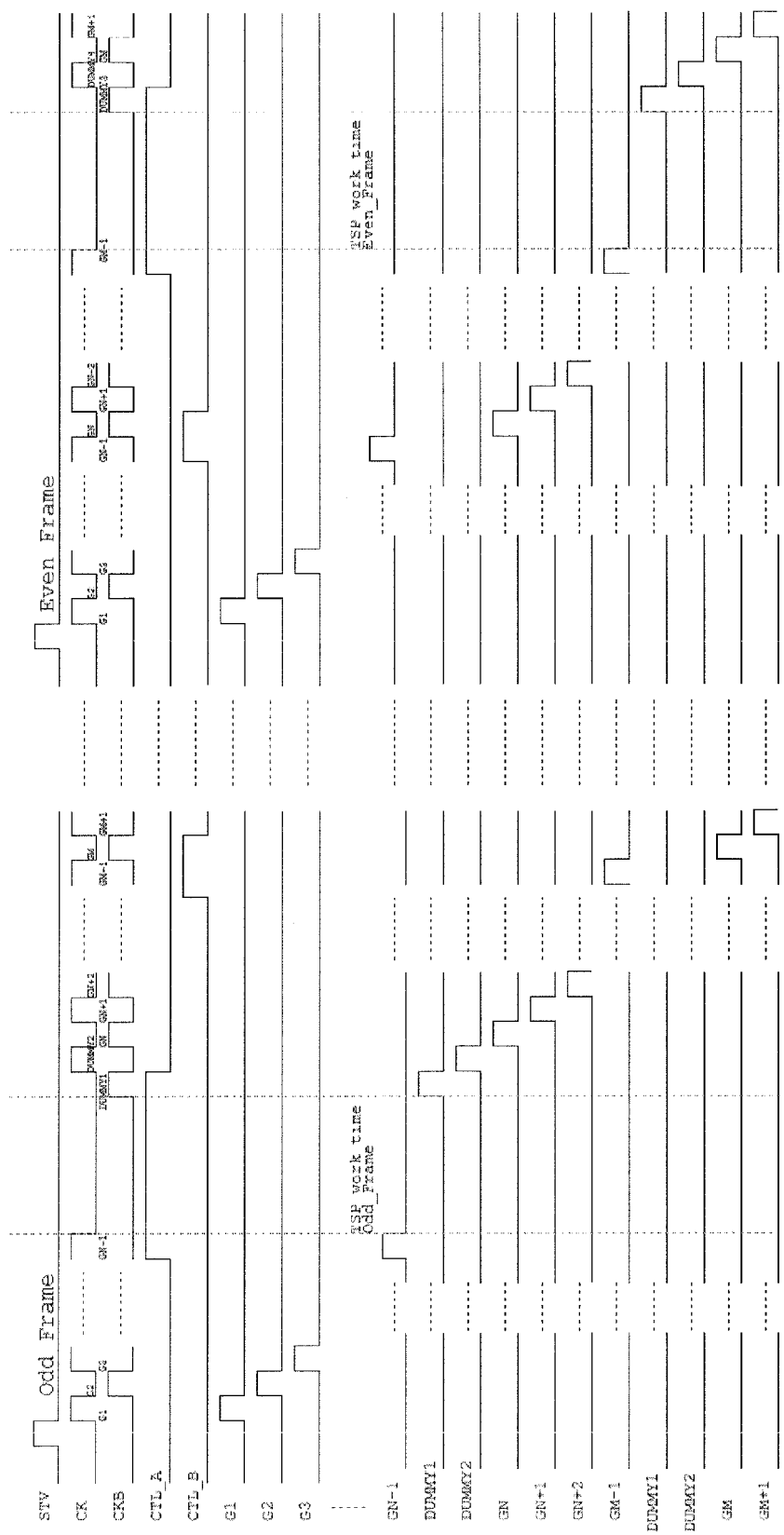
FIG. 5 is an operation timing diagram of the preferred gate driving circuit in the embodiment of the present disclosure.

FIG. 5 is referred to for the position schematic diagram of the predetermined time for which the clock signal CK is suspended in the timing diagram. It can be seen that, the position of the delay shift module with respect to the plurality of shift register units connected in cascade corresponds to the position of the start time of the predetermined time for which the clock signal is suspended within each frame with respect to the clock signal throughout the process. That is to say, in order that the gate line drive signal reaches the corresponding delay shift module at the predetermined time for which the clock signal is suspended, so as to implement a function thereof, it is necessary to design the time for which the clock signal is suspended and the position where the delay shift module is located correspondingly.

Preferably, the switch control module includes a group of switch elements corresponding to each of the delay shift modules. Each group of switch elements includes a first switch element and a second switch element. In a group of switch elements corresponding to a delay shift module between shift register units at an (N−1)-th stage and that at an N-th stage, a first terminal of the first switch element and a first terminal of the second switch element are both connected with an output terminal of the shift register unit at the (N−1)-th stage; a second terminal of the first switch element is connected with a gate line drive signal input terminal of the delay shift module; a gate line drive signal output terminal of the delay shift module is connected with an input terminal of the shift register unit at the N-th stage; a second terminal of the second switch element is connected with an output terminal of the shift register unit at the N-th stage; a control terminal of the first switch element is connected with a first control signal line, and a control terminal of the second switch element is connected with a second control signal line.

The controlling different delay shift modules to be connected between adjacent shift register units, between adjacent frames, by a switch control module specifically includes: controlling turn-on of the output terminal of the shift register unit at the (N−1)-th stage to be connected with the input terminal of the delay shift module by the first switch element, at a start time of the predetermined time for which the clock signal is suspended, within a frame, the delay shift module being connected between the adjacent shift registers, and other delay shift modules controlling the output terminal of the shift register unit at the (N−1)-th stage to be connected with the input terminal of shift register at the N-th stage by the second switch element.

Preferably, when the delay shift module is connected between the adjacent shift register units, the first control signal line CTL_A controls the first switch element to be on before output of the clock signal is suspended for a clock cycle, as shown in FIG. 5. With the signal of the first control signal line CTL_A as an example, when the clock signal CK is a high level signal at GN-1, the CTL_A begins to become to be at the high level, the clock signal CK controls the first switch element to be closed after the output of the clock signal is restored for a clock cycle. That is, the CTL_A restores to the low level after the clock signal CKB outputs the high level signal at DUMMY1. The first control signal line CTL_A is arranged in such a way to ensure effective transmission of the signal.

That is to say, the first switch control signal line can control ON (the first terminal is connected with the second terminal) or OFF (the first terminal is disconnected from the second terminal) of all the first switch elements in the switch control module; and the second switch control signal line can control ON (the first terminal is connected with the second terminal) or OFF (the first terminal is disconnected from the second terminal) of all the second switch elements in the switch control module. Therefore, when the delay shift module is connected therein, the first switch element is ON (and the second switch element is OFF), and when the delay shift module is not connected therein, the second switch element is ON (and the first switch element is OFF). In this way, the function of the switch control module can be implemented by only two switch control signal lines, which is conducive to simplification of layout of the gate driving circuit and reduction of the overall size.

Each frame of the gate driving circuit includes a display stage and a touch scanning stage, the touch scanning stage being included within the predetermined time for which the clock signal is suspended. That is to say, here specifically the gate driving circuit is used in a touch display device, and the touch scanning stage thereof (corresponding to the above-described TSP acquisition process) is designed within the predetermined time for which the clock signal is suspended, which achieves that the predetermined time for which a touch screen panel suspends operation within the adjacent odd and even frames are staggered, so as to solve the problem of the dark lines as viewed by human eyes.

In summary, the present disclosure provides the delay shift modules in at least two different positions (for example, between the (N−1)-th stage and the N-th stage, and between the (M−1)-th stage and the M-th stage), and controls whether they operate or not by the switch control module, so as to achieve an effect of staggering the predetermined time for which the panel suspends operation in the adjacent frames. The present disclosure can stagger positions of the predetermined times for which the touch screen panel suspends operation within the adjacent odd and even frames, so as to solve the problem of the dark line as viewed by human eyes.

It should be noted that, in this specification, terms like "first" and "second" are only used to differentiate one entity or operation from another, but are not necessarily used to indicate any practical relationship or order between these entities or operations. Moreover, terms such as "include", "comprise" or any variation of the terms mean "including but not limited to". Therefore, a process, method, object, or device that includes a series of elements not only includes these elements, but also includes other elements that are not specified expressly, or may further include inherent elements of the process, method, object or device. In the case that there are no more limitations, in the context of a element that is defined by "includes one . . . ", the process, method, object or device that includes the element may include other identical elements.

The above embodiments are only used to illustrate the technical solution of the present disclosure, which is not intended to limit the disclosure. Although the above embodiments have described the present disclosure in detail, those of ordinary skill in the art should understand that: they can still make modification or equivalent replacement to the technical solutions of the above embodiments; and the modification, or equivalent replacement does not render the technical solution of each embodiment in the present disclosure departing from the spirit and principle of the present disclosure.

What is claimed is:

1. A gate driving circuit, comprising a plurality of shift register units connected in cascade, wherein, the gate driving circuit further comprises:
   at least two delay shift modules, each delay shift module being located between adjacent shift register units, and at least one cascaded shift register unit being further provided between the delay shift modules; and
   a switch control module respectively connected with the delay shift modules, the switch control module being used for controlling different delay shift modules to be connected between the adjacent shift register units between adjacent frames, and enabling transmission of a gate line drive signal to skip other delay shift modules not connected therein within each frame;
   the delay shift module being used for suspending a clock signal connected with the delay shift module for a predetermined time when connected between the adjacent shift register units, storing the gate line drive signal from a shift register unit at an adjacent previous stage within the predetermined time for which the clock signal is suspended, and transmitting the gate line drive signal to a shift register unit at an adjacent next stage after the clock signal is restored.

2. The gate driving circuit according to claim 1, wherein, the switch control module includes a group of switch elements corresponding to each of the delay shift modules, each group of switch elements being used for outputting a switch control signal to a delay shift module corresponding thereto, the switch control signal controlling the delay shift module to be connected between the adjacent shift register units, or enabling the transmission of the gate line drive signal to skip the delay shift module.

3. The gate driving circuit according to claim 2, wherein, each group of switch elements include a first switch element and a second switch element; in a group of switch elements corresponding to a delay shift module between shift register unit at an (N−1)-th stage and that at an N-th stage, a first terminal of the first switch element and a first terminal of the second switch element are both connected with an output terminal of the shift register unit at the (N−1)-th stage; a second terminal of the first switch element is connected with an input terminal of the delay shift module; an output terminal of the delay shift module is connected with an input terminal of the shift register unit at the N-th stage; a second terminal of the second switch element is connected with an output terminal of the shift register unit at the N-th stage; a control terminal of the first switch element is connected with a first control signal line, and a control terminal of the second switch element is connected with a second control signal liner, N being an integer no less than 2.

4. The gate driving circuit according to claim 3, wherein, the delay shift module includes a first shift register unit and a second shift register unit connected in cascade, the two shift register units being connected in cascade between the shift register unit at the (N−1)-th stage and that at the Nth stage, an input terminal of the first shift register unit serving as the input terminal of the delay shift module, and an output terminal of the second shift register unit serving as the output terminal of the delay shift module, the input terminal of the first shift register unit being connected with the output terminal of the shift register unit at the (N−1)-th stage via the first switch element; the output terminal of the first shift register unit and a reset terminal of the second shift register unit being connected with the output terminal of the shift register unit at the N-th stage and a reset terminal of the shift register unit at the (N−1)-th stage at one point, and N being an integer no less than 2.

5. The gate driving circuit according to claim 2, wherein, the switch element is a thin film field-effect transistor.

6. An array substrate, wherein, the array substrate comprises the gate driving circuit according to claim 1.

7. A display device, wherein, the display device comprises the array substrate according to claim 6.

8. A driving method for use in the gate driving circuit according to claim wherein, the method comprises:
controlling different delay shift modules to be connected between adjacent shift register units, between adjacent frames, by a switch control module;
enabling transmission of a gate line drive signal to skip other delay shift modules not connected therein, within each frame, by the switch control module.

9. The driving method according to claim 8, wherein, when the delay shift module is connected between the adjacent shift register units, a clock signal connected with the delay shift module is suspended for a predetermined time, and a touch scanning stage is entered within the predetermined time for which the clock signal is suspended.

10. The driving method according to claim 8, wherein, the switch control module includes a group of switch elements corresponding to each of the delay shift modules, each group of switch elements including a first switch element and a second switch element; in a group of switch elements corresponding to a delay shift module between shift register units at an (N−1)-th stage and an N-th stage, a first terminal of the first switch element and a first terminal of the second switch element are both connected with an output terminal of the shift register unit at the (N−1)-th stage; a second terminal of the first switch element is connected with a gate line drive signal input terminal of the delay shift module: a gate line drive signal output terminal of the delay shift module is connected with an input terminal of the shift register unit at the N-th stage; a second terminal of the second switch element is connected with an output terminal of the shift register unit at the N-th stage; a control terminal of the first switch element is connected with a first control signal line, and a control terminal of the second switch element is connected with a second control signal line;
the controlling different delay shift modules to be connected between adjacent shift register units, between adjacent frames, by a switch control module specifically includes:
controlling the output terminal of the shift register unit at the (N−1)-th stage to be connected with the input terminal of the delay shift module by the first switch element at a start time of the predetermined time for which the clock signal is suspended, within a frame, the delay shift module being connected between the adjacent shift registers, and other delay shift modules controlling the output terminal of the shift register unit at the (N−1)-th stage to be connected with the input terminal of the shift register at the N-th stage by the second switch element, N being an integer no less than 2.

11. The driving method according to claim 10, wherein, when the delay shift module is connected between the adjacent shift register units, the first control signal line controls the first switch element to be ON before output of the clock signal is suspended for a clock cycle, and controls the first switch element to be ON after the output of the clock signal is restored for a clock cycle.

* * * * *